United States Patent
Tan et al.

(10) Patent No.: US 7,989,530 B2
(45) Date of Patent: Aug. 2, 2011

(54) NONLINEAR POLYMER COMPOSITES AND METHODS OF MAKING THE SAME

(75) Inventors: Daniel Qi Tan, Rexford, NY (US);
Patricia Chapman Irwin, Altamont, NY (US); Yang Cao, Niskayuna, NY (US);
Venkat Subramaniam Venkataramani, Clifton Park, NY (US)

(73) Assignee: General Electric Company, Niskayuna, NY (US)

(*) Notice: Subject to any disclaimer, the term of this patent is extended or adjusted under 35 U.S.C. 154(b) by 358 days.

(21) Appl. No.: 12/179,905

(22) Filed: Jul. 25, 2008

(65) Prior Publication Data

US 2008/0293864 A1 Nov. 27, 2008

Related U.S. Application Data

(63) Continuation-in-part of application No. 11/286,062, filed on Nov. 23, 2005.

(51) Int. Cl.
*C08J 3/00* (2006.01)
(52) U.S. Cl. ........ 524/394; 524/544; 524/403; 524/436; 528/92; 528/411
(58) Field of Classification Search .................. 524/394, 524/544, 403, 436; 528/92, 411
See application file for complete search history.

(56) References Cited

U.S. PATENT DOCUMENTS

| | | | |
|---|---|---|---|
| 4,870,484 A * | 9/1989 | Sonehara | 348/791 |
| 4,917,810 A * | 4/1990 | Tsunooka et al. | 252/62.9 R |
| 5,555,219 A * | 9/1996 | Akiyama et al. | 349/182 |
| 5,638,251 A | 6/1997 | Goel et al. | |
| 5,650,031 A | 7/1997 | Bolon et al. | |
| 5,951,908 A * | 9/1999 | Cui et al. | 252/62.9 R |
| 5,962,122 A | 10/1999 | Walpita et al. | |
| 6,544,651 B2 | 4/2003 | Wong et al. | |
| 6,558,744 B2 * | 5/2003 | Jarrell et al. | 427/385.5 |
| 6,632,109 B2 | 10/2003 | Irwin et al. | |
| 6,762,237 B2 | 7/2004 | Glatkowski et al. | |
| 6,778,053 B1 | 8/2004 | Irwin et al. | |
| 6,864,306 B2 * | 3/2005 | Rao et al. | 524/394 |
| 7,267,840 B2 * | 9/2007 | Ohnishi et al. | 427/100 |
| 2003/0017351 A1 | 1/2003 | Hayashi et al. | |
| 2004/0022935 A1 * | 2/2004 | Ohnishi et al. | 427/100 |
| 2004/0060730 A1 | 4/2004 | Lauf et al. | |
| 2004/0265551 A1 | 12/2004 | Takaya et al. | |
| 2005/0045064 A1 * | 3/2005 | Oya | 106/170.27 |

(Continued)

FOREIGN PATENT DOCUMENTS

CN 1670073 9/2005

(Continued)

OTHER PUBLICATIONS

EP Search Report, EP06124499, Feb. 27, 2007.

(Continued)

*Primary Examiner* — Peter D. Mulcahy
*Assistant Examiner* — Henry Hu
(74) *Attorney, Agent, or Firm* — Ann M. Agosti

(57) ABSTRACT

A nonlinear composition comprises a polymeric material and at least one ferroelectric, antiferroelectric, or paraelectric particle, wherein the composition has a permittivity greater than or equal to about 5. A method of making a nonlinear composition comprises combining a polymeric material, and at least one ferroelectric, antiferroelectric, or paraelectric particle. The composition has a permittivity greater than or equal to about 5.

22 Claims, 2 Drawing Sheets

U.S. PATENT DOCUMENTS

| | | |
|---|---|---|
| 2005/0080175 A1 | 4/2005 | Paik et al. |
| 2005/0161149 A1 | 7/2005 | Yokota et al. |
| 2005/0256240 A1 | 11/2005 | Nelson |
| 2007/0116976 A1 | 5/2007 | Tan et al. |
| 2007/0117886 A1 | 5/2007 | Tan et al. |
| 2007/0117898 A1 | 5/2007 | Tan et al. |
| 2007/0117913 A1 | 5/2007 | Tan et al. |
| 2007/0258190 A1 | 11/2007 | Irwin et al. |

FOREIGN PATENT DOCUMENTS

| | | |
|---|---|---|
| EP | 1271578 | 2/2003 |
| WO | W00189827 | 11/2001 |
| WO | 2003054259 | 7/2003 |
| WO | W02006124670 | 11/2006 |

OTHER PUBLICATIONS

CN1670073, English Abstract, D. Lijie et al., Sep. 21, 2005.

JP58141222, Publication Date Aug. 22, 1983, "High-Dielectric Film" (Abstract Only).

Colin Kydd Campbell, "Experimental and Theoretical Characterization of an Antiferroelectric Ceramic Capacitor for Power Electronics," IEEE Transactions on Components and Packaging Technologies, vol. 25, No. 2, pp. 211-216, Jun. 2002.

Jianwen Xu et al., "Low-loss percolative dielectric composite," Applied Physics Letters 87, 082907, pp. 082907-1-082907-3, 2005.

Y. Bai et al., "High-dielectric constant ceramic-powder polymer composites," Applied Physics Letters, vol. 76, No. 25, pp. 3804-3806, Jun. 19, 2000.

E. Aulagner et al., "(PVDF/BaTiO3) and (PP/BaTiO3) Films for Energy Storage Capacitors," 1995 IEEE 5th International Conference on Conduction and Breakdown in Solid Dielectrics, pp. 423-427, 1995.

D. Dimos, "Perovskite Thin Films for High-Frequency Capacitor Applications", Annual Review of Materials Science, vol. 28, pp. 397-419, (Volume publication date Aug. 1998).

P. F. Fantoni et al., "Wire System Aging Assessment and Condition Monitoring," Nordic Nuclear Safety Research, ISBN 87-7893-192-4, Apr. 2006.

M. L. Krogh et al., "High Breakdown Strength, Multilayer Ceramics for Compact Pulsed Power Applications," Federal Manufacturing & Technologies, Allied Signal, KCP-613-6212, Jul. 1999.

M. T. Lanagan et al., "Microwave Dielectric Properties of Antiferroelectric Lead Zirconate", Journal of the American Ceramic Society, vol. 71, No. 4, pp. 311-316, Apr. 1988.

M. P. McNeal et al., "Particle Size Dependent High Frequency Dielectric Properties of Barium Titanate", ISAF '96, Proceedings of the Tenth IEEE International Symposium on Applications of Ferroelectrics, pp. 837-840.

* cited by examiner

US 7,989,530 B2

NONLINEAR POLYMER COMPOSITES AND METHODS OF MAKING THE SAME

CROSS-REFERENCE TO RELATED APPLICATION

This application is a continuation-in-part application of application Ser. No. 11/286,062 filed on Nov. 23, 2005, which is hereby incorporated by reference in its entirety.

FIELD OF THE INVENTION

The invention includes embodiments that relate to a nonlinear polymer composite. The invention includes embodiments that relate to a method of making a nonlinear polymer composite and articles comprising the same.

BACKGROUND OF THE INVENTION

The development of nonlinear transmission line microwave sources for applications such as high power microwave, laser weapon and mobile platforms includes several significant challenges for dielectric materials, including the need for high permittivity, low dielectric loss, high frequency, high voltage pulse, and a pulse repetition rate. These requirements drive the development of nonlinear dielectric materials film with a very high dielectric properties and breakdown strength under pulse power.

The interaction of transient high power electromagnetic pulses with materials requires the inclusion of nonlinear effects in the constitutive relation for the material. The change of inductance (L) or capacitance (C) in transmission line materials can directly change the voltage of the pulses that propagate on the line because the phase velocity of the wave is v=1/SQR(LC). Although ceramics exhibit high permittivity, they are restricted by low breakdown strength. Similarly, the magnetic materials are greatly limited to a relatively lower frequency due to the significant increase in the magnetic loss and low breakdown strength. These materials also lose their permeability at high frequencies and the corresponding nonlinear effect. It is therefore desirable to have a nonlinear composition that exhibits high dielectric strength, high permittivity, and low dielectric loss, and is not limited by high operating frequencies.

BRIEF SUMMARY OF THE INVENTION

In one embodiment a nonlinear composition comprises a polymeric material, and at least one ferroelectric, antiferroelectric, or paraelectric particle. The composition has a permittivity greater than or equal to about 5.

In another embodiment, a method of making a nonlinear composition comprises combining a polymeric material, and at least one ferroelectric, antiferroelectric, or paraelectric particle. The composition has a permittivity greater than or equal to about 5.

DETAILED DESCRIPTION OF THE INVENTION

Figure 1:
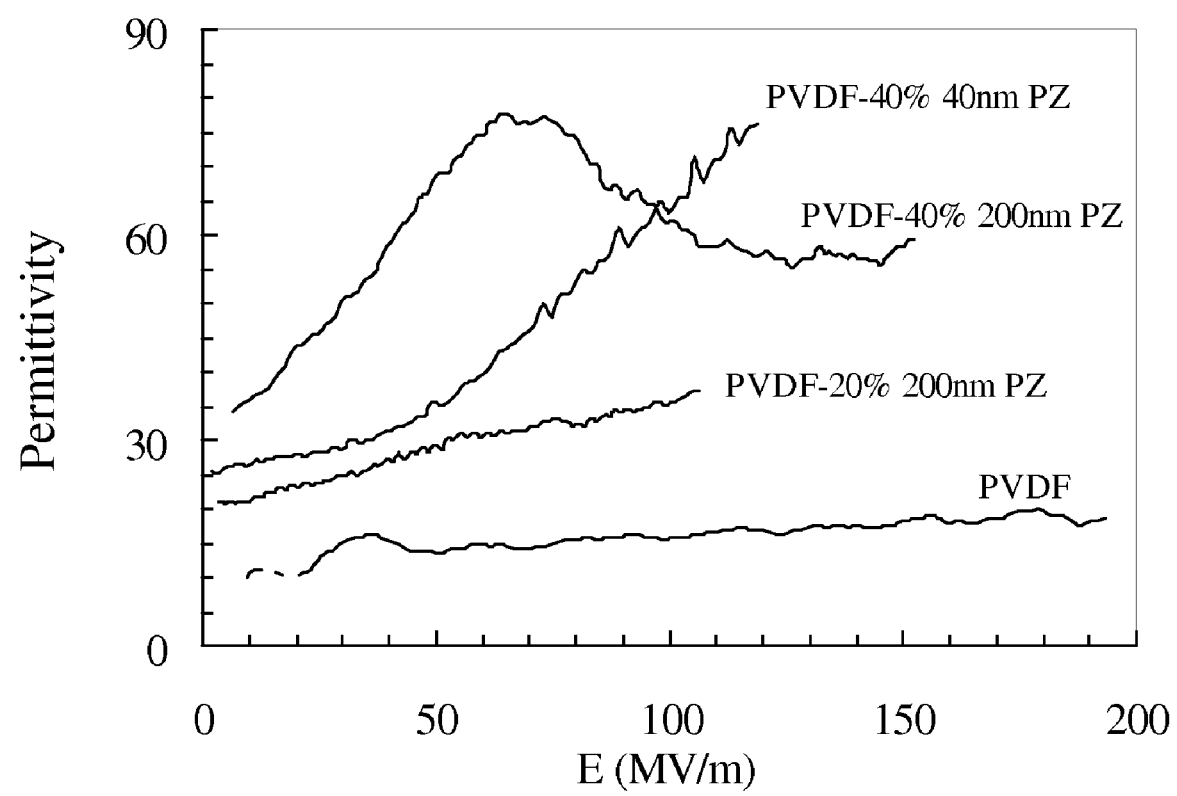
FIG. 1 is a graph illustrating the nonlinear change of permittivity under an electric field for a polyvinylidene fluoride (PVDF) polymer containing lead zirconate particles.

Disclosed herein are nonlinear ceramic compositions comprising a polymeric material. The compositions also comprise ferroelectric, antiferroelectric, or paraelectric particles, or a combination thereof. The compositions have high dielectric strength, high permittivity, and low dielectric loss, for subsequent film forming processes.

The polymeric material provides a matrix for nonlinear fillers such as ferroelectric, antiferroelectric, or paraelectric particles. In one embodiment, the ferroelectric particles comprise relaxor ferroelectric particles. The polymeric material may comprise a polymer selected from a wide variety of thermoplastic polymers, thermosetting polymers, blends of thermoplastic polymers, blends of thermosetting polymers, or blends of thermoplastic polymers with thermosetting polymers. The polymeric material can comprise a homopolymer, a copolymer such as a star block copolymer, a graft copolymer, an alternating block copolymer or a random copolymer, ionomer, dendrimer, or a combination comprising at least one of the foregoing. The polymeric material may also be a blend of polymers, copolymers, or the like, or a combination comprising at least one of the foregoing.

Examples of thermoplastic polymers that can be used in the polymeric material include polyacetals, polyacrylics, polycarbonates, polyalkyds, polystyrenes, polyolefins, polyesters, polyamides, polyaramides, polyamideimides, polyarylates, polyurethanes, epoxies, phenolics, silicones, polyarylsulfones, polyethersulfones, polyphenylene sulfides, polysulfones, polyimides, polyetherimides, polytetrafluoroethylenes, polyetherketones, polyether etherketones, polyether ketone ketones, polybenzoxazoles, polyoxadiazoles, polybenzothiazinophenothiazines, polybenzothiazoles, polypyrazinoquinoxalines, polypyromellitimides, polyquinoxalines, polybenzimidazoles, polyoxindoles, polyoxoisoindolines, polydioxoisoindolines, polytriazines, polypyridazines, polypiperazines, polypyridines, polypiperidines, polytriazoles, polypyrazoles, polycarboranes, polyoxabicyclononanes, polydibenzofurans, polyphthalides, polyacetals, polyanhydrides, polyvinyl ethers, polyvinyl thioethers, polyvinyl ketones, polyvinyl halides, polyvinyl nitriles, polyvinyl esters, polysulfonates, polysulfides, polythioesters, polysulfones, polysulfonamides, polyureas, polyphosphazenes, polysilazanes, polypropylenes, polyethylene terephthalates, polyvinylidene fluorides, polysiloxanes, polyphenylene ether, cyanoethyl cellulose, cellulose triacetate, or the like, or a combination comprising at least one of the foregoing thermoplastic polymers.

Exemplary thermoplastic polymers include polyetherimide, polyvinylidene fluoride, polyvinylidine fluoride-trifluoroethylene P(VDF-TrFE), polyvinylidene-tetrafluoroethylene copolymers P(VDF-TFE), and polyvinylidine hexafluoropropylene copolymers P(VDF-HFP), epoxy, polyester, polyimide, polyarylate, polyphenylsulfone, polystyrene, polyethersulfone, polyamideimide, polyurethane, polycarbonate, polyetheretherketone, polyphenylene ether, cyanoethyl cellulose, cellulose triacetate, or the like, or a combination comprising at least one of the foregoing.

Examples of blends of thermoplastic polymers include acrylonitrile-butadiene-styrene/nylon, polycarbonate/acrylonitrile-butadiene-styrene, polyphenylene ether/polystyrene, polyphenylene ether/polyamide, polycarbonate/polyester, polyphenylene ether/polyolefin, cellulosic cyanoresin/cellulose triacetate, cyanoethyl pullulan/polyvinylidine fluoride or the like, or a combination comprising at least one of the foregoing.

Examples of thermosetting polymers that can be used in the polymeric material include resins of epoxy/amine, epoxy/anhydride, isocyanate/amine, isocyanate/alcohol, unsaturated polyesters, vinyl esters, unsaturated polyester and vinyl ester blends, unsaturated polyester/urethane hybrid resins, polyurethane-ureas, thermosetting polyphenylene ether, silicone, fluorosilicone, benzimidazoles, cyanate esters, bismaleimides, reactive dicyclopentadiene resin, reactive polyamides, or the like, or a combination comprising at least one of the foregoing.

In one embodiment, suitable high temperature thermosetting polymers include thermosetting polymers that can be made from an energy activatable thermosetting pre-polymer composition. Examples include polyurethanes such as urethane polyesters, silicone polymers, phenolic polymers, amino polymers, epoxy polymers, bismaleimides, polyimides, and furan polymers. The energy activatable thermosetting pre-polymer component can comprise a polymer precursor and a curing agent. The polymer precursor can be heat activated, eliminating the need for a catalyst. The curing agent selected will not only determine the type of energy source needed to form the thermosetting polymer, but may also influence the resulting properties of the thermosetting polymer. Examples of curing agents include aliphatic amines, aromatic amines, acid anhydrides, peroxides, lewis acids or the like, or a combination comprising at least one of the foregoing. The energy activatable thermosetting pre-polymer composition may include a solvent or processing aid to lower the viscosity of the composition for ease of extrusion including higher throughputs and lower temperatures. The solvent could help retard the crosslinking reaction and could partially or totally evaporate during or after polymerization. The solvent could also act as a reactive diluent, acting as a viscosity aid before cure and reacting into the final polymer during the curing process.

In a preferred embodiment, the polymeric material comprises a cellulosic cyanoresin polymer.

It is desirable for the polymeric material to have a glass transition or softening temperature of greater than or equal to about 120 degrees Celsius. In one embodiment, it is desirable for the polymeric material to have a glass transition or softening temperature of greater than or equal to about 150 degrees Celsius. In another embodiment, it is desirable for the polymeric material to have a glass transition or softening temperature of greater than or equal to about 200 degrees Celsius. In yet another embodiment, it is desirable for the high temperature poly polymeric material to have a glass transition or softening temperature of greater than or equal to about 260 degrees Celsius.

It is also desirable for the polymeric material to have a permittivity of greater than or equal to about 4. In one embodiment, it is desirable for the polymeric material to have a permittivity of greater than or equal to about 7. In another embodiment, it is desirable for the polymeric material to have a permittivity of greater than or equal to about 10. In yet another embodiment, it is desirable for the polymeric material to have a permittivity of greater than or equal to about 15. In yet another embodiment, it is desirable for the polymeric material to have a permittivity of greater than or equal to about 20.

The tensile strength of the polymeric material is one measure of the flexibility and ductility of the material. It is desirable for the polymeric material to have a tensile strength of greater than or equal to about 2,000 psi. In another embodiment, the polymeric material has a tensile strength greater than or equal to about 4,000 psi. In another embodiment, the polymeric material has a tensile strength greater than or equal to about 6,000 psi. In yet another embodiment, the polymeric material has a tensile strength greater than or equal to about 8,000 psi.

In one embodiment, the polymeric material is present in an amount of about 5 to about 99.999 weight % of the total weight of the composition. In another embodiment, the polymeric material is present in an amount of about 10 weight % to about 99.99 weight % of the total weight of the composition. In another embodiment, the polymeric material is present in an amount of about 30 weight % to about 99.5 weight % of the total weight of the composition. In another embodiment, the polymeric material is present in an amount of about 50 weight % to about 99.3 weight % of the total weight of the composition.

The particles present in the compositions of the invention can exist in the form of nanoparticles or micrometer sized particles. The term "particle", as used herein, should be interpreted at referring to any one of a ferroelectric, relaxor ferroelectric, antiferroelectric, or paraelectric particles, unless otherwise specified. These particles generally have a dielectric constant that is similar to or moderately higher than the dielectric constant of the polymeric material. In an exemplary embodiment of the invention, the particles are ceramic particles.

The particles can be advantageously dispersed in the polymeric material in order to increase the dielectric constant of the composition. The well-dispersed particles within the polymeric material provide improved properties over a polymeric material that does not contain the particles. These improved properties include a higher dielectric constant, higher energy densities, good breakdown strength, corona resistance, improved impact strength and mechanical hardness, as well as improved ease of processing for soft polymers and a Class A surface finish.

In one embodiment, ceramic antiferroelectric particles are dispersed in the polymeric material, and the antiferroelectric particles are converted to ferroelectric particles upon the application of an activating field. In one embodiment, the activating field can comprise a biasing electrical field. In another embodiment, the activating field can comprise a biasing electric field that is applied in the presence of a source of thermal energy or heat. Heat may be applied in the form of convection, conduction or radiation to the sample during the application of a biasing electrical field. The thermal energy or heat may be applied, for example, by an oven. Thus, the antiferroelectric particles are field-tunable, nonlinear dielectric particles that can undergo a phase transition from a low dielectric state (antiferroelectric state) to a high dielectric state (ferroelectric state) upon being exposed to a biasing electric field. These advantageous properties of the antiferroelectric particles permit the composition to be field tunable. Field tunable compositions can advantageously have their dielectric properties adjusted upon demand depending upon the application for which they are to be used.

The ferroelectric effect is an electrical phenomenon whereby certain ionic crystals may exhibit a spontaneous dipole moment. There are two main types of ferroelectrics, displacive and order-disorder. For example, the effect in barium titanate (BT) and strontium titanate (ST), is of the displacive type and is due to a polarization catastrophe, in which, if an ion is displaced from equilibrium slightly, the force from the local electric fields due to the ions in the crystal increases faster than the elastic restoring forces. This leads to an asymmetrical shift in the equilibrium ion positions and hence to a permanent dipole moment. In an order-disorder ferroelectric, there is a dipole moment in each unit cell, but at high temperatures they are pointing in random directions. Upon lowering the temperature and going through the phase transition, the dipoles order, all pointing in the same direction within a domain.

Upon being dispersed in the polymeric material, the ferroelectric particles can intrinsically undergo a decrease in dielectric constant upon the application of an electric field of more than or equal to about 50 kilovolts/millimeter. As a result, the dielectric constant of the polymeric composite is tunable by an amount of greater than or equal to about 300% when compared with a polymeric material that does not contain the ferroelectric particles.

The permittivity of a polymeric material comprising ferroelectric particles is also affected by the application of an electric field to the particles. Specifically, the permittivity is decreased upon the application of an electric field. On the contrary, the permittivity of a polymeric material comprising antiferroelectric particles is increased upon the application of an electric field to the particles. Both composites exhibit a nonlinear response to an external excitation and thereby can change the velocity of a propagating wave. FIG. 1 illustrates the electric field dependence of permittivity of PVDF polymers with and without particle fillers, as well as the effect of the ferroelectric and antiferroelectric states. Without particles fillers, the permittivity of PVDF is low and is independent of an applied electric field. When the PVDF comprises 40 weight percent, 40 nm lead zirconate (PZ) particles, the permittivity increases significantly with an increase in electric field. Specifically, the permittivity increases from about 25 with no applied electric field, to about 80 with an applied electric field of 120 MV/m. If a polymeric material comprises larger antiferroelectric particles, the ferroelectric—antiferroelectric phase transition occurs at a lower electric field. As a result, the permittivity decreases once the particles transition to the ferroelectric state, as shown in FIG. 1 for PVDF comprising 40 weight percent 200 nm lead zirconate particles.

The antiferroelectric particles used in the invention are generally between their antiferroelectric and ferroelectric state prior to incorporating them into the composition. It is generally desirable for the antiferroelectric particles in the antiferroelectric state to have a dielectric constant that is as close as possible to the dielectric constant of the polymeric material. In one embodiment, the antiferroelectric particles (in the antiferroelectric state) have a dielectric constant whose value is at least 50% higher than the value of the dielectric constant of the polymeric material. In one embodiment, the antiferroelectric particles (in the antiferroelectric state) have a dielectric constant whose value is within 10% of the value of the dielectric constant of the polymeric material. In another embodiment, the antiferroelectric particles (in the antiferroelectric state) have a dielectric constant whose value is within 50% of the value of the dielectric constant of the polymeric material. In yet another embodiment, the antiferroelectric particles (in the antiferroelectric state) have a dielectric constant whose value is within 100% of the value of the dielectric constant of the polymeric material. In yet another embodiment, the antiferroelectric particles (in the antiferroelectric state) have a dielectric constant whose value is within 500% of the value of the dielectric constant of the polymeric material.

Relaxor ferroelectric particles are ferroelectric particles that exhibit a frequency dependent dielectric constant. With an increase in frequency of measurement of the dielectric constant, the dielectric constant of the relaxor ferroelectric material shifts to a higher frequency and decreases to a lower value. The relaxor ferroelectric particles also exhibit a temperature dependent dielectric constant. This is usually observed at a paraelectric to ferroelectric phase transition of the particles. The relaxor ferroelectric particles may have the general formula $Pb(M_{1/3}Nb_{2/3})O_3$—$Pb(Zr_{1-x}Ti_x)O_3$ where where x is an amount of up to about 1 and M is Mg or Ni, or the general formula $(Ba_{1-x}Sr_x)TiO_3$ where where x is an amount of up to about 1. Examples of relaxor ferroelectric particles include $Pb(Mg_{1/3}Nb_{2/3})O_3$, $Pb(Mg_{1/3}Nb_{2/3})O_3$—$PbTiO_3$, $Pb(Mg_{1/3}Nb_{2/3})O_3$—$Pb(ZrTi)O_3$, $(Pb,La)(Zr,Ti)O_3$, and $(BaSr)TiO_3$.

The particles used in the invention may be derived from perovskite. In one embodiment, the particle has the formula (I) $Pb(M_1, M_2, M_3, \ldots)O_3$ (I) where $M_1$, $M_2$, $M_3$, are transition metals or rare earth metals. Examples of transition metals are those present in groups 3d, 4d and 5d of the periodic table, such as, of example, scandium, iron, titanium chromium, zirconium, or the like, or a combination comprising at least one of the foregoing transition metals. Examples of rare earth metals are lanthanum, cerium, neodymium, gadolinium, samarium, or the like, or a combination comprising at least one of the foregoing rare earth metals.

Another example of a particle is one that comprises lead zirconium titanate (PZT) shown in the formula (II) below: $Pb(Zr_xTi_{1-x})O_3$ (III) where x is less than or equal to about 1. In one embodiment, x can have a value of about 0.3 to about 1. In another embodiment, x can have a value of about 0.6 to about 1. In yet another embodiment, x can have a value of about 0.9 to about 1. The PZT particles exist in the form of a solid solution that spans a wide compositional space and, consequently, a wide range of dielectric properties. The phase boundaries and electrical properties of PZT can also be further modified by doping. For example, substitution of $La^{3+}$ for $Pb^{2+}$ can lead to ferroelectric particles with a dielectric constant up to 7000 that can be converted into antiferroelectric particles. Examples of PZT and PZT derivatives include $PbHfO_3$, $PbZrO_3$, modified $Pb(ZrTi)O_3$, $PbLa(ZrSnTi)O_3$, $PbNb(ZrSnTi)O_3$, or the like, or a combination comprising at least one of the foregoing particles. An exemplary antiferroelectric particle is lead zirconate ($PbZrO_3$).

Another example of a particle is one that comprises lead lanthanum zirconium titanates (PLZT) in formula (III): $Pb_{1-x}La_x(Zr_yTi_{1-y})_{1-x/4}O_3$ (III) where x and y can each have a value of up to 1 respectively and wherein x and y are independent of each other. In one embodiment, x can have a value of about 0.1 to about 0.3, while y can have a value of about 0.8 to about 1.

Yet another example of a particle is one that comprises lead scandium niobates (PSN) in formula (IV) or lead scandium tantalate (PST) in formula (V): $PbSc_xNb_{1-y}O_3$ (IV) $PbSc_xTa_{1-x}O_3$ (V).

Other particles may comprise $PbSc_{1/2}Nb_{1/2}O_3$—$PbLu_{1/2}Nb_{1/2}O_3$, $SrTiO_3$—$PbZrO_3$, lead scandium niobium titanate (PSNT) and lead lutetium niobium titanate (PLuNT).

In another embodiment, the particles are lead-free. Examples of lead-free particles include $(Sr,Bi)Ta_2O_9$, $NaNbO_3$, $(K,Na)(Nb,Ta)O_3$, $KNbO_3$, $BaZrO_3$, $Na_{0.25}K_{0.25}Bi_{0.5}TiO_3$, $Ag(Ta,Nb)O_3$ and $Na_{0.5}Bi_{0.5}TiO_3$—$K_{0.5}Bi_{0.5}TiO_3$—$BaTiO_3$ or the like, or a combination thereof.

As noted above, antiferroelectric particles can undergo a phase transition from a low dielectric constant (antiferroelectric state) to a high dielectric constant (ferroelectric state) when subjected to an electrical biasing field. In one embodiment, the antiferroelectric particles can undergo a phase transition from an antiferroelectric (low dielectric constant) state to a ferroelectric (high dielectric constant) state when subjected to an electrical biasing field of greater than or equal to about 4 kilovolts/millimeter (kV/mm). In one embodiment, the antiferroelectric particles can undergo a phase transition from an antiferroelectric (low dielectric constant) state to a ferroelectric (high dielectric constant) state when subjected to an electrical biasing field of greater than or equal to about 60 kilovolts/millimeter (kV/mm). In one embodiment, the antiferroelectric particles can undergo a phase transition from an antiferroelectric (low dielectric constant) state to a ferroelectric (high dielectric constant) state when subjected to an electrical biasing field of greater than or equal to about 100 kilovolts/millimeter (kV/mm). In yet another embodiment, the antiferroelectric particles that can undergo a phase transition from an antiferroelectric (low dielectric constant) state to a ferroelectric (high dielectric constant) state when subjected to an electrical biasing field of greater than or equal to about 200 kilovolts/millimeter (kV/mm).

In one embodiment, the dielectric constant of the composition increases by greater than or equal to 50% upon the phase transition. In another embodiment, the dielectric constant of the composition increases by greater than or equal to 100% upon the phase transition. In another embodiment, the dielectric constant of the composition increases by greater than or equal to 500% upon the phase transition.

As noted above, the particles used in the invention can have particle sizes in the nanometer range ($10^{-9}$ meter range) or micrometer range ($10^{-6}$ meter range). In one embodiment, the particles have particle sizes of about 5 nanometers to about 10 micrometers. In another embodiment, the particles have particle sizes of about 10 nanometers to about 1 micrometer. In another embodiment, the particles have particle sizes of about 20 nanometers to about 500 nanometers. In yet another embodiment, the particles have particle sizes of about 40 nanometers to about 200 nanometers.

In one embodiment, the particles can be surface treated to facilitate bonding with the polymeric material. In one embodiment, the surface treatment comprises coating the particles with a silane-coupling agent, or if desired, a phosphonic acid may be used to surface treat the particles. Examples of suitable silane-coupling agents include tetramethylchlorosilane, hexadimethylenedisilazane, gamma-aminopropoxysilane, or the like, or a combination comprising at least one of the foregoing silane coupling agents. The silane-coupling agents generally enhance compatibility of the particles with the polymeric material, and phosphonic acid promotes the formation of strong bonds between the particles and the coupling agent. These functionalizing agents can improve dispersion of the particles within polymeric material.

As noted above, the particles have at least one dimension in the nanometer or micrometer range. It is generally desirable for the particles to have an average largest dimension that is less than or equal to about 10 micrometers. The dimension may be a diameter, edge of a face, length, or the like. The particles may have shapes whose dimensionalities are defined by integers, e.g., the particles are either 1, 2 or 3-dimensional in shape. They may also have shapes whose dimensionalities are not defined by integers (e.g., they may exist in the form of fractals). The particles may exist in the form of spheres, flakes, fibers, whiskers, or the like, or a combination comprising at least one of the foregoing forms. The particles may have cross-sectional geometries that may be circular, ellipsoidal, triangular, rectangular, polygonal, or a combination comprising at least one of the foregoing geometries. The particles, as commercially available, may exist in the form of aggregates or agglomerates prior to incorporation into the polymeric material or even after incorporation into the polymeric material. An aggregate comprises more than one particle in physical contact with one another, while an agglomerate comprises more than one aggregate in physical contact with one another.

Regardless of the exact size, shape and composition of the particles, they may be dispersed into the polymeric material at loadings of about 0.1 to about 85 wt % of the total weight of the composition when desired. In one embodiment, the particles are present in an amount of greater than or equal to about 1 wt % of the total weight of the composition. In another embodiment, the particles are present in an amount of greater than or equal to about 10 wt % of the total weight of the composition. In yet another embodiment, the particles are present in an amount of greater than or equal to about 30 wt % of the total weight of the composition. In one embodiment, the particles are present in an amount of less than or equal to 85 wt % of the total weight of the composition. In another embodiment, the particles are present in an amount of less than or equal to about 70 wt % of the total weight of the composition. In yet another embodiment, the particles are present in an amount of less than or equal to about 60 wt % of the total weight of the composition.

The polymeric material together with the particles and any other optionally desired fillers may generally be combined in several different ways such as, but not limited to compounding, melt blending, solution blending, or the like, or a combination comprising at least one of the foregoing methods. Melt blending of the composition involves the use of shear force, extensional force, compressive force, ultrasonic energy, electromagnetic energy, thermal energy or a combination comprising at least one of the foregoing forces or forms of energy and is conducted in processing equipment wherein the aforementioned forces are exerted by a single screw, multiple screws, intermeshing co-rotating or counter rotating screws, non-intermeshing co-rotating or counter rotating screws, reciprocating screws, screws with pins, barrels with pins, rolls, rams, helical rotors, or a combination comprising at least one of the foregoing.

Melt blending involving the aforementioned forces may be conducted in machines such as, but not limited to, single or multiple screw extruders, Buss kneader, Henschel, helicones, Ross mixer, Banbury, roll mills, molding machines such as injection molding machines, vacuum forming machines, blow molding machine, or then like, or a combination comprising at least one of the foregoing machines. It is generally desirable during melt or solution blending of the composition to impart a specific energy of about 0.01 to about 10 kilowatt-hour/kilogram (kwhr/kg) of the composition. Within this range, a specific energy of greater than or equal to about 0.05, preferably greater than or equal to about 0.08, and more preferably greater than or equal to about 0.09 kwhr/kg is generally desirable for blending the composition. Also desirable is an amount of specific energy less than or equal to about 9, preferably less than or equal to about 8, and more preferably less than or equal to about 7 kwhr/kg for blending the composition.

In one embodiment, the polymeric material in powder form, pellet form, sheet form, or the like, may be first dry blended with the particles and other optional fillers if desired in a Henschel or a roll mill, prior to being fed into a melt blending device such as an extruder or Buss kneader. In another embodiment, the particles are introduced into the melt blending device in the form of a masterbatch. In such a process, the masterbatch may be introduced into the melt blending device downstream of the polymeric material.

When a masterbatch is used, the particles may be present in the masterbatch in an amount of about 10 to about 85 wt %, of the total weight of the masterbatch. In one embodiment, the particles are used in an amount of greater than or equal to about 30 wt % of the total weight of the masterbatch. In another embodiment, the particles are used in an amount of greater or equal to about 40 wt %, of the total weight of the masterbatch. In another embodiment, the particles are used in an amount of greater than or equal to about 45 wt %, of the total weight of the masterbatch. In one embodiment, the particles are used in an amount of less than or equal to about 85 wt %, of the total weight of the masterbatch. In another embodiment, the particles are used in an amount of less than or equal to about 75 wt %, of the total weight of the masterbatch. In another embodiment, the particles are used in an amount of less than or equal to about 65 wt %, of the total weight of the masterbatch.

The composition comprising the polymeric material and the particles may be subject to multiple blending and forming steps if desirable. For example, the composition may first be extruded and formed into pellets. The pellets may then be fed into a molding machine where it may be formed into other desirable shapes. Alternatively, the composition emanating from a single melt blender may be formed into sheets or strands and subjected to post-extrusion processes such as annealing, uniaxial or biaxial orientation.

Solution blending may also be used to manufacture the composition. The solution blending may also use additional energy such as shear, compression, ultrasonic vibration, or the like to promote homogenization of the particles with the polymeric material. In one embodiment, a polymeric material suspended in a fluid (e.g., a solvent) may be introduced into an ultrasonic sonicator along with the particles. The mixture may be solution blended by bead milling followed by sonication for a time period effective to break up and disperse the particles within the polymeric material and the fluid. The polymeric material along with the particles may then be dried, extruded and molded if desired. It is generally desirable for the fluid to swell the polymeric material during the process of sonication. Swelling the polymeric material generally improves the ability of the particles to be impregnated within the polymeric material during the solution blending process and consequently improves dispersion.

In another embodiment related to solution blending, the particles are sonicated together with polymeric material precursors. Polymeric material precursors are generally monomers, dimers, trimers, or the like, which can be reacted into polymeric materials. A fluid such as a solvent may optionally be introduced into the sonicator with the particles and the polymeric material precursors. The time period for the sonication is generally an amount effective to promote encapsulation of the particles by the polymeric material precursors. After the encapsulation, the polymeric material precursor is then polymerized to form a composition within which is dispersed the particles.

Suitable examples of monomers that may be used to facilitate this method of encapsulation and dispersion are those used in the synthesis of polymers such as, but not limited to polyacetals, polyacrylics, polycarbonates, polystyrenes, polyesters, polyamides, polyamideimides, polyarylates, polyurethanes, polyarylsulfones, polyethersulfones, polyarylene sulfides, polyvinyl chlorides, polysulfones, polyetherimides, polytetrafluoroethylenes, polyetherketones, polyether etherketones, or the like, or a combination comprising at least one of the foregoing. In one embodiment, the mixture of polymeric material precursors, fluid and/or the particles is sonicated for a period of about 1 minute to about 24 hours. In another embodiment, the mixture is sonicated for a period of greater than or equal to about 5 minutes. In another embodiment, the mixture is sonicated for a period of greater than or equal to about 10 minutes. In another embodiment, the mixture is sonicated for a period of greater than or equal to about 15 minutes. In one embodiment, the mixture is sonicated for a period of less than or equal to about 15 hours. In another embodiment, the mixture is sonicated for a period of less than or equal to about 10 hours. In another embodiment, the mixture is sonicated for a period of and more preferably less than or equal to about 5 hours.

Solvents may optionally be used in the solution blending of the composition. The solvent may be used as a viscosity modifier, or to facilitate the dispersion and/or suspension of particles. Liquid aprotic polar solvents such as propylene carbonate, ethylene carbonate, butyrolactone, acetonitrile, benzonitrile, nitromethane, nitrobenzene, sulfolane, dimethylformamide, N-methylpyrrolidone (NMP), or the like, or a combination comprising at least one of the foregoing solvents may be used. Polar protic solvents such as water, methanol, acetonitrile, nitromethane, ethanol, propanol, isopropanol, butanol, or the like, or a combination comprising at least one of the foregoing polar protic solvents may be used. Other non-polar solvents such as benzene, toluene, methylene chloride, carbon tetrachloride, hexane, diethyl ether, tetrahydrofuran, or the like, or a combination comprising at least one of the foregoing solvents may also be used if desired. Co-solvents comprising at least one aprotic polar solvent and at least one non-polar solvent may also be used. In one embodiment, the solvent is xylene or n-methylpyrrolidone.

If a solvent is used, it may be utilized in an amount of about 1 to about 90 wt %, of the total weight of the composition. In one embodiment, if a solvent is used, it may be utilized in an amount of about 2 to about 50 wt %, of the total weight of the composition. In yet another embodiment, if a solvent is used, it may be utilized in an amount of about 3 to about 30 wt %, of the total weight of the composition. In yet another embodiment, if a solvent is used, it may be utilized in an amount of about 5 to about 20 wt %, of the total weight of the composition. It is generally desirable to evaporate the solvent before, during and/or after the blending of the composition.

After solution blending, the solution comprising the desired composition can be cast, spin cast, dip coated, spray painted, brush painted and/or electrostatically spray painted onto a desired substrate. The solution is then dried leaving behind the composition on the surface. In another embodiment, the solution comprising the desired composition may be spun, compression molded, injection molded or blow molded to form an article comprising the composition.

Blending can be assisted using various secondary species such as dispersants, binders, modifiers, detergents, and additives. Secondary species may also be added to enhance one to more of the properties of the composition. Blending can also be assisted by pre-coating the particles with a thin layer of the polymeric material or with a phase that is compatible with the polymeric material, such as, for example a silane layer or a phosphoric acid layer.

In one embodiment, a composition comprising the polymeric material and the nonlinear ferroelectric or antiferroelectric particles in random orientations and locations may be subjected to an electrical field in order to orient the nonlinear particles. The application of the electrical field can be conducted when the composition is in the melt state or in a solution. Solidification can occur in the presence of the electrical field. Upon being subjected to the electrical field, the nonlinear particles with large polarization can be re-aligned into preferred orientation. In one embodiment, the electric field can be used to align these particles into columnar structure so as to give rise to higher dielectric constant.

A composition comprising a polymeric material and the antiferroelectric particles in a low dielectric constant state has advantages over the polymeric material alone. In one embodiment, the composition has a dielectric constant that is at least 10% greater than a composition comprising polymeric material alone. In another embodiment, the composition has a dielectric constant that is at least 50% greater than the polymeric material alone. In another embodiment, the composition has a dielectric constant that is at least 100% greater than the polymeric material alone.

Upon applying an electrical field for converting antiferroelectric particles to ferroelectric particles, the composition can have a dielectric constant that is at least 200% greater than the polymeric material alone. In one embodiment, upon conversion, the composition has a dielectric constant that is at least 300% greater than a composition comprising polymeric material alone. In another embodiment, upon conversion, the composition has a dielectric constant that is at least 400% greater than the polymeric material alone. In another embodiment, upon conversion, the composition has a dielectric constant that is at least 500% greater than the polymeric material alone.

A composition comprising a polymeric material and ferroelectric particles in a high dielectric constant state has further advantages over the polymeric material and particles in a low dielectric constant state (weakened ferroelectric state). In one embodiment, the composition has a dielectric constant that is at least 50% greater than a composition comprising a polymeric material and particles in a low dielectric constant state. In another embodiment, the composition has a dielectric constant that is at least 100% greater than the polymeric material and particles in a low dielectric constant state. In another embodiment, the composition has a dielectric constant that is at least 500% greater than the polymeric material and particles in a low dielectric constant state.

The nonlinear composition also has a breakdown voltage that is advantageously greater than the nonlinear ceramic material alone. In one embodiment, the composition has a breakdown voltage that is at least 50 kilovolts/millimeter. The breakdown strength is generally determined in terms of the thickness of the composition. In another embodiment, the composition has a breakdown voltage that is at least 100 kilovolts/millimeter. In another embodiment, the composition has a breakdown voltage that is at least 300 kilovolts/millimeter. In yet another embodiment, the composition has a breakdown voltage that is at least 500 kilovolts/millimeter.

In one embodiment, the nonlinear composition has a breakdown strength of greater than or equal to about 200 kilovolts/millimeter. The composition advantageously has an energy density of greater than or equal to about 1 J/cm$^3$ to greater than or equal to about 10 J/cm$^3$. In addition, with the use of the biasing electric field, the dielectric constant of the composition can be increased by up to one order of magnitude depending upon the amount of the particles in the composition.

The nonlinear composition also has a corona resistance that is advantageously greater than the polymeric material alone. In one embodiment, the composition has a corona resistance that is resistant to a current of about 1000 volts to 5000 volts applied for about 200 hours to about 2000 hours. In another embodiment, the composition has a corona resistance that is resistant to a current of about 1000 volts to 5000 volts applied for about 250 hours to about 1000 hours. In yet another embodiment, the composition has a corona resistance that is resistant to a current of about 1000 volts to 5000 volts applied for about 500 hours to about 900 hours.

The nonlinear composition has a dielectric constant greater than or equal to about 3 when measured at frequencies of about 1 to about $10^6$ hertz (Hz). In one embodiment, the composition has a dielectric constant greater than or equal to about 5 when measured at frequencies of about 1 to about $10^6$ hertz (Hz). In yet another embodiment, the composition has a dielectric constant greater than or equal to about 10 when measured at frequencies of about 1 to about $10^6$ hertz (Hz). In yet another embodiment, the composition has a dielectric constant greater than or equal to about 50 when measured at frequencies of about 1 to about $10^6$ hertz (Hz).

It is desirable for the nonlinear composition to have a glass transition or softening point temperature of greater than or equal to about 100 degrees Celsius. In one embodiment, it is desirable for the composition to have a glass transition or softening point temperature of greater than or equal to about 120 degrees Celsius. In another embodiment, it is desirable for composition to have a glass transition or softening point temperature of greater than or equal to about 150 degrees Celsius. In yet another embodiment, it is desirable for the composition to have a glass transition or softening point temperature of greater than or equal to about 180 degrees Celsius. In yet another embodiment, it is desirable for the composition to have a glass transition or softening point temperature of greater than or equal to about 200 degrees Celsius.

It is also desirable for the nonlinear particle filled composition to have a permittivity of greater than or equal to about 5. In one embodiment, it is desirable for the composition to have a permittivity of greater than or equal to about 10. In one embodiment, it is desirable for the composition to have a permittivity of greater than or equal to about 20. In another embodiment, it is desirable for the composition to have a permittivity of greater than or equal to about 30. In yet another embodiment, it is desirable for the composition to have a permittivity of greater than or equal to about 50. In yet another embodiment, it is desirable for the composition to have a permittivity of greater than or equal to about 100.

The tensile strength of the nonlinear composition is one measure of the flexibility and ductility of the composition. It is desirable for the composition to have a tensile strength of greater than or equal to about 3,000 psi. In another embodiment, the composition has a tensile strength greater than or equal to about 5,000 psi. In another embodiment, the composition has a tensile strength greater than or equal to about 7,000 psi. In yet another embodiment, the composition has a tensile strength greater than or equal to about 9,000 psi.

The nonlinear compositions may also be optically transparent. In one embodiment, the compositions have a transmissivity to visible light of greater than or equal to about 70%. In another embodiment, the compositions have a transmissivity to visible light of greater than or equal to about 80%. In yet another embodiment, the compositions have a transmissivity to visible light of greater than or equal to about 90%. In yet another embodiment, the compositions have a transmissivity to visible light of greater than or equal to about 95%. In yet another embodiment, the composition also has a Class A surface finish when molded. Molded articles can be manufactured by injection molding, blow molding, compression molding, or the like, or a combination comprising at least one of the foregoing.

The compositions can advantageously be used in high power microwave, laser weapon and mobile platform devices for applications including non-lethal devices for counter-electronics and counter-personnel. The compositions can advantageously be used in nonlinear transmission lines and for pulse sharpening. The compositions may also be used in films, including thick plates which are films having a thickness between about 0.1 um and about 50 um. The compositions are especially useful in optical and millimeter-wave, semiconductor devices and systems, for a broad range of applications such as data transmission in digital circuits.

The following examples, which are meant to be exemplary, not limiting, illustrate compositions and methods of manufacturing of some of the various embodiments described herein.

EXAMPLES

Example 1

Figure 2:
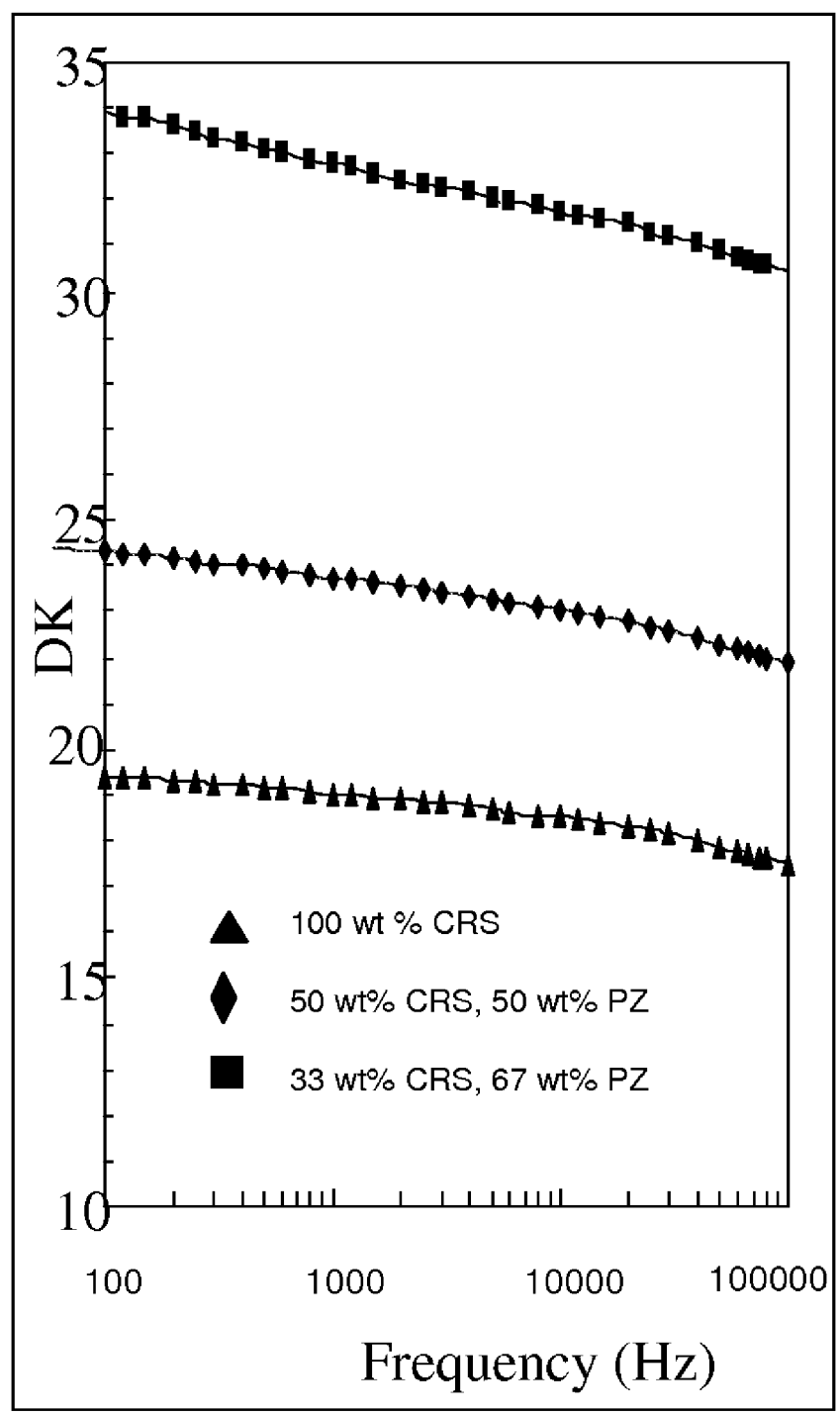
FIG. 2 illustrates the dielectric behavior of cyanoethyl pullulan films filled with antiferroelectric particles.

Effect of Antiferroelectric Particles on Dielectric Constant of Polymer Matrix An antiferroelectric lead zirconate powder was milled in acetone using a paint shaker for 20 minutes. The milled powder was dried and sieved through a 200-mesh sieve. Two grams of cyanothyl pullulan (CRS) was first dissolved in 10 ml of dimethylformamide (DMF) solvent to form a CRS solution. The nanosized antiferroelectric particles were added to the CRS solution in an amount of about 20 vol %. The CRS solution containing the particles was then mixed using a high speed centrifugal mixer followed by a high power sonication. The solution was then cast onto a glass substrate under a clean hood. The solution was dried until films were formed. The composition films were subjected to dielectric constant tests at room temperature at a frequency of 1 to $10^6$ Hz using a dielectric analyzer HP4285A manufactured by Hewlett Packard. The film thickness was between 5 and 50 micrometers, which was sputter coated with platinum. The platinum established electrical contact with the electrodes of the dielectric analyzer. The antiferroelectric particles increased the dielectric constant of the CRS polymers, as illustrated in FIG. 2.

All ranges disclosed herein are inclusive of the endpoints, and the endpoints are combinable with each other. The terms "first," "second," and the like as used herein do not denote any order, quantity, or importance, but rather are used to distinguish one element from another. The modifiers "about" and "approximately" used in connection with a quantity are inclusive of the stated value and have the meaning dictated by the context (e.g., includes the degree of error associated with measurement of the particular quantity). The use of the terms "a" and "an" and "the" and similar referents in the context of describing the invention (especially in the context of the following claims) are to be construed to cover both the singular and the plural, unless otherwise indicated herein or clearly contradicted by context.

While the invention has been described in detail in connection with a number of embodiments, the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A nonlinear composition comprising:
   a polymeric material comprising a cellulosic cyanoresin polymer; and
   at least one ferroelectric, antiferroelectric, or paraelectric particle.
2. The composition of claim 1, wherein the composition has a permittivity greater than or equal to about 5.
3. The composition of claim 1, wherein the polymeric material has a permittivity greater than or equal to about 5.
4. The composition of claim 1, wherein the composition has a dielectric constant greater than or equal to about 4.
5. The composition of claim 1, wherein the composition has a permittivity greater than or equal to about 10.
6. The composition of claim 1, wherein the composition has a breakdown strength of greater than or equal to about 200 kilovolts/millimeter.
7. The composition of claim 1, wherein the composition has a glass transition or softening point temperature of greater than or equal to about 100 degrees Celsius.
8. The composition of claim 1, wherein the at least one particle has a dielectric constant whose value is at least 50% higher than the value of the dielectric constant of the polymeric material.
9. The composition of claim 1, wherein the at least one particle comprises a perovskite.
10. The composition of claim 1, wherein the at least one particle has the general formula (I) $Pb(M_1, M_2, M_3, \ldots)O_3$ (I) where $M_1$, $M_2$, $M_3$, are transition metals or rare earth metals, Pb is lead and O is oxygen.
11. The composition of claim 1, wherein the at least one particle has the general formula $Pb(M_{1/3}Nb_{2/3})O_3$—$Pb(Zr_{1-x}Ti_x)O_3$ where x is an amount of up to about 1 and M is Mg or Ni.
12. The composition of claim 1, wherein the at least one particle has the general formula $(Ba_{1-x}Sr_x)TiO_3$ where x is an amount of up to about 1.
13. The composition of claim 1, wherein the at least one particle comprises lead zirconium titanate (PZT) having the formula (II): $Pb(Zr_xTi_{1-x})O_3$ (II) where x is an amount of up to about 1.
14. The composition of claim 1, wherein the at least one particle comprises $PbHfO_3$, $PbZrO_3$, modified $Pb(ZrTi)O_3$, $PbLa(ZrSnTi)O_3$, or $PbNb(ZrSnTi)O_3$.
15. The composition of claim 1, wherein the at least one particle comprises lead lanthanum zirconium titanates (PLZT) having the formula (III): $Pb_{1-x}La_x(Zr_yT_{1-y})_{1-x/4}O_3$ (III) where x and y is an amount of up to about 1 respectively and wherein x and y are independent of each other.
16. The composition of claim 1, wherein the at least one particle comprises lead scandium niobates (PSN) having the formula (IV) or lead scandium tantalate (PST) having the formula (V): $PbSc_xNb_{1-y}O_3$ (IV) $PbSc_xTa_{1-x}O_3$ (V) where x is an amount of up to about 1.
17. The composition of claim 1, wherein the at least one particle comprises lead scandium niobium titanate (PSNT), or lead lutetium niobium titanate (PLuNT).
18. The composition of claim 1, wherein the at least one particle comprises $(Sr,Bi)Ta_2O_9$, $NaNbO_3$, $(K,Na)(Nb,Ta)O_3$, $KNbO_3$, $BaZrO_3$, $Na_{0.25}K_{0.25}Bi_{0.5}TiO_3$, $Ag(Ta,Nb)O_3$, or $Na_{0.5}Bi_{0.5}TiO_3$—$K_{0.5}Bi_{0.5}TiO_3$—$BaTiO_3$.
19. The composition of claim 1, wherein the at least one particle is a ferroelectric, antiferroelectric, paraelectric or ferroelectric ceramic particle.
20. An article comprising the composition of claim 1.
21. The article of claim 20, wherein the article is a film.
22. The article of claim 20, wherein the article is a transmission line.

* * * * *